(12) United States Patent
Haga

(10) Patent No.: US 9,991,096 B2
(45) Date of Patent: Jun. 5, 2018

(54) PLASMA PROCESSING APPARATUS

(71) Applicant: TOKYO ELECTRON LIMITED, Tokyo (JP)

(72) Inventor: Toshio Haga, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days. days.

(21) Appl. No.: 14/339,516

(22) Filed: Jul. 24, 2014

(65) Prior Publication Data

US 2015/0027637 A1   Jan. 29, 2015

(30) Foreign Application Priority Data

Jul. 25, 2013   (JP) ................. 2013-154370

(51) Int. Cl.
  *H01L 21/00*   (2006.01)
  *C23C 16/00*   (2006.01)
  *H01J 37/32*   (2006.01)

(52) U.S. Cl.
  CPC .. *H01J 37/32137* (2013.01); *H01J 37/32091* (2013.01); *H01J 37/32174* (2013.01); *H01J 37/32568* (2013.01)

(58) Field of Classification Search
  None
  See application file for complete search history.

(56) References Cited

U.S. PATENT DOCUMENTS

| | | | |
|---|---|---|---|
| 6,199,505 B1 * | 3/2001 | Sato | H01J 37/32082 118/723 E |
| 6,511,577 B1 * | 1/2003 | Johnson | C23C 16/4412 118/723 E |
| 7,494,561 B2 * | 2/2009 | Koshiishi | H01J 37/32027 118/723 E |
| 7,506,610 B2 * | 3/2009 | Koshiishi | H01J 37/32082 118/723 E |
| 2001/0037770 A1 * | 11/2001 | Otsubo | C23C 16/4405 118/723 I |
| 2003/0098127 A1 * | 5/2003 | Nakano | H01J 37/32082 156/345.44 |
| 2005/0257743 A1 * | 11/2005 | Koshiishi | H01J 37/32082 118/723 E |
| 2006/0021580 A1 * | 2/2006 | Hirano | H01J 37/32082 118/722 |

(Continued)

FOREIGN PATENT DOCUMENTS

| | | |
|---|---|---|
| JP | 60-201611 A | 10/1985 |
| JP | 2004-193565 A | 7/2004 |

(Continued)

*Primary Examiner* — Parviz Hassanzadeh
*Assistant Examiner* — Michelle Crowell
(74) *Attorney, Agent, or Firm* — Rothwell, Figg, Ernst & Manbeck, P.C.

(57) ABSTRACT

Provided is a plasma processing apparatus in which a variable inductor is installed in series with a variable condenser in a second power feeding unit that distributes and supplies high-frequency power to an inner upper electrode 56. As a result, a characteristic around a resonance point may be broad in a capacitance-outer/inner power distribution ratio of the variable condenser (varicon). Therefore, an area around the resonance point may be stably used as a controllable area within a variable range of varicon capacitance.

5 Claims, 14 Drawing Sheets

(56) References Cited

U.S. PATENT DOCUMENTS

| | | | |
|---|---|---|---|
| 2006/0220574 A1* | 10/2006 | Ogawa | H01J 37/32082 315/111.21 |
| 2008/0223523 A1* | 9/2008 | Handa | H01J 37/32091 156/345.44 |
| 2008/0277062 A1* | 11/2008 | Koshimizu | H01J 37/32082 156/345.28 |
| 2010/0193128 A1* | 8/2010 | Koumura | H03H 7/38 156/345.28 |
| 2010/0252199 A1* | 10/2010 | Marakhtanov | H01J 37/32091 156/345.48 |
| 2013/0277333 A1* | 10/2013 | Misra | C23F 1/08 216/61 |

FOREIGN PATENT DOCUMENTS

| | | |
|---|---|---|
| JP | 2004-193566 A | 7/2004 |
| JP | 2004-311646 A | 11/2004 |

* cited by examiner

PLASMA PROCESSING APPARATUS

CROSS-REFERENCE TO RELATED APPLICATION

This application is based on and claims priority from Japanese Patent Application No. 2013-154370, filed on Jul. 25, 2013 with the Japan Patent Office, the disclosures of which are incorporated herein in their entirety by reference.

TECHNICAL FIELD

The present disclosure relates to a capacitive-coupled plasma processing apparatus that variably controls a ratio of high-frequency powers distributed and supplied to inner and outer upper electrodes disposed to face a lower electrode where an object to be processed is placed.

BACKGROUND

For a fine machining or processing such as, for example, etching, deposition, oxidation, or sputtering in a manufacturing process of a semiconductor device or a flat panel display (FPD), plasma is used to perform an excellent reaction on processing gas at a comparatively low temperature. Discharge is typically used for generating plasma. Plasma processing apparatuses are generally classified into a plasma processing apparatus using high-frequency discharge and a plasma processing apparatus using microwave discharge. High-frequency discharge systems are also classified into a capacitive-coupled system in which a parallel flat panel electrode is installed within a processing container and an inductive-coupled system in which a spiral or swirling electrode is attached around the processing container. Among several plasma generation systems, the capacitive-coupled system has become a mainstream of a device for mass production and a device for device development.

In the capacitive-coupled plasma processing apparatus, an upper electrode and a lower electrode are arranged in parallel within a pressure-reducible processing container or reaction container, an object to be processed, for example, a semiconductor wafer, is placed on the lower electrode, and high frequency waves having a predetermined frequency are applied to the upper electrode or the lower electrode through a matching unit. Electrons are accelerated by a high-frequency electric field generated by the high frequency waves, plasma is generated by dissociation and ionizing collision of the electrons, and molecules and atoms of the processing gas, and a desired plasma processing (for example, an etching process) is performed on a wafer surface by radicals or ions in the plasma.

In a plasma process, (in-plane) uniformity of the process is a basic requirement for improving yield, the importance of the (in-plane) uniformity gradually increases with the progress of miniaturization of the semiconductor device or an increase in diameter of the semiconductor wafer, and a required level thereof increases. In this regard, in a conventional capacitive-coupled plasma processing apparatus, the uniformity of the process significantly depends on uniformity of the density of plasma on the semiconductor wafer. Thus, researches have been repeatedly conducted into a structure of an electrode used for generating plasma, in particular, an electrode (high-frequency electrode) to which the high frequency waves are applied.

As one typical example, a capacitive-coupled plasma processing apparatus is known, in which an upper electrode facing a lower electrode where an object to be processed is placed is divided into an inner electrode and an outer electrode in a radial direction to variably control a ratio of high-frequency powers for generating plasma which are distributed to both electrodes (Japanese Patent Laid-Open Publication No. 2004-193566).

In the capacitive-coupled plasma processing apparatus, the outer upper electrode is electrically connected to an output terminal of a high-frequency power supply that outputs the high frequency waves for generating plasma through a tubular conductive member and the inner upper electrode is electrically connected to the output terminal through a rod type central conductive member. A variable condenser is inserted in the middle of the central conductive member, and as a result, capacitance of the variable condenser is variably controlled by, for example, a step motor.

SUMMARY

A plasma processing apparatus, including: a processing container configured to be evacuated; an outer upper electrode installed annularly to face a lower electrode where an object to be processed is placed in the processing container; an inner upper electrode disposed to be insulated inside a radial direction of the outer upper electrode; a processing gas supply unit configured to supply a processing gas to a processing space between the outer upper electrode and the inner upper electrode, and the lower electrode; a first high-frequency power supply configured to output a first high-frequency wave having a frequency suitable for generating plasma of the processing gas; a first power feeding unit provided with a cylindrical conductive member consecutively connected to the outer upper electrode in a circumferential direction and configured to apply the first high-frequency wave from the first high-frequency power supply to the outer upper electrode through the cylindrical conductive member; a second power feeding unit provided with a rod-shaped central conductive member connected to the center of the inner upper electrode, and configured to branch the first high-frequency wave from the first high-frequency power supply from the first power feeding unit to supply the branched-off first high-frequency wave to the inner upper electrode through the central conductive member; and a variable condenser and a variable inductor installed in series to the central conductive member in the second power feeding unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
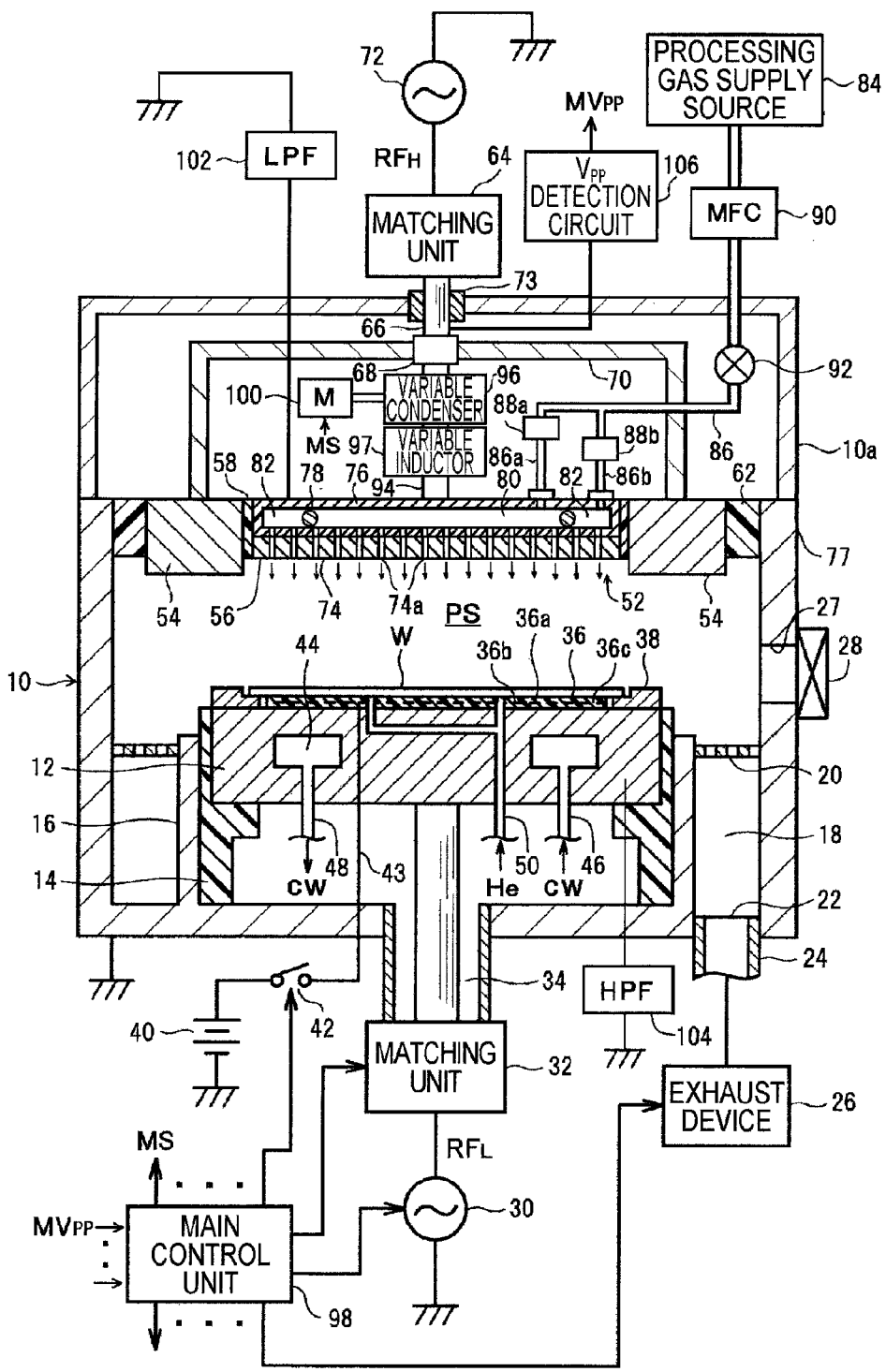
FIG. 1 is a cross-sectional view illustrating a configuration of a plasma processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the capacitive-coupled plasma processing apparatus configured to distribute the high-frequency power to two inner and outer upper electrodes divided in the radial direction, a resonance point is inevitably present within a capacitance variation range of the variable condenser. That is, a closed circuit is formed between respective high-frequency power feeding units that distribute the high-frequency waves from the high-frequency power supply to both upper electrodes through an electrostatic capacitor (fixed condenser) that is present between the inner upper electrode and the outer upper electrode. The closed circuit may include not only the electrostatic capacitor (fixed condenser) and the variable condenser between the electrodes, but also an inductance associated with a conductor of each high-frequency power feeding unit. The closed circuit becomes a resonance state when a capacitance of the variable condenser has a predetermined value.

In such a plasma processing apparatus in the related art, an outer/inner power distribution ratio is significantly changed at a rapid change rate (slope) around the resonance point even though the capacitance of the variable condenser is slightly changed which makes fine adjustment difficult. As a result, even if the distribution ratio slightly deviates from a desired distribution ratio to the resonance point, large current flows in the closed circuit which may result in damage of the variable condenser.

Thus, in the related art, the capacitance of the variable condenser is adapted to be variably controlled by only one area (generally, an area lower than a resonance area) by avoiding the resonance point and an area (resonance area) therearound. However, since a variable range or a dynamic range of the outer/inner power distribution ratio is small in reality, an effect is slightly insufficient as an adjustment knob for controlling a profile of a plasma density distribution or a process characteristic in the radial direction.

The present disclosure is contrived to solve the problems in the conventional art and an object of the present disclosure is to remarkably improve a function as an adjustment knob for controlling an in-plane profile of a plasma density distribution characteristic of a variable condenser installed to control an outer/inner power distribution ratio or a process characteristic, in a capacitive-coupled plasma processing apparatus that distributes and supplies high-frequency power to an inner upper electrode and an outer upper electrode disposed to face a lower electrode where an object to be processed is placed.

According to a first aspect of the present disclosure, there is provided a plasma processing apparatus including: a processing container configured to be evacuated; an outer upper electrode installed annularly to face a lower electrode where an object to be processed is placed in the processing container; an inner upper electrode disposed to be insulated inside a radial direction of the outer upper electrode; a processing gas supply unit configured to supply a processing gas to a processing space between the outer upper electrode and the inner upper electrode, and the lower electrode; a first high-frequency power supply configured to output a first high-frequency wave having a frequency suitable for generating plasma of the processing gas; a first power feeding unit provided with a cylindrical conductive member consecutively connected to the outer upper electrode in a circumferential direction and configured to apply the first high-frequency wave from the first high-frequency power supply to the outer upper electrode through the cylindrical conductive member; a second power feeding unit provided with a rod-shaped central conductive member connected to the center of the inner upper electrode, and configured to branch the first high-frequency wave from the first high-frequency power supply from the first power feeding unit to supply the branched-off first high-frequency wave to the inner upper electrode through the central conductive member; and a variable condenser and a variable inductor installed in series to the central conductive member in the second power feeding unit.

In the apparatus configured as described above, the resonance point is inevitably present in a capacitance variation range of the variable condenser (varicon). That is, the closed circuit is formed between the respective high-frequency power feeding units that distribute the high-frequency waves from the high-frequency power supply to both the upper electrodes through the electrostatic capacitor (fixed condenser) that is present between the inner upper electrode and the outer upper electrode. The closed circuit may include not only the electrostatic capacitor (fixed condenser) and the variable condenser (varicon) between the electrodes but also the inductance associated with the conductor of each high-frequency power feeding unit and the inductance of the variable inductor and the closed circuit becomes a resonance state when the capacitance of the variable condenser (varicon) has a predetermined value. However, by variably controlling the inductance of the variable inductor, in particular, by adjusting the inductance of the variable inductor to a low value, a characteristic around the resonance point may be broadened in the varicon capacitance—outer/inner power distribution ratio. Therefore, the area around the resonance point may be stably used as a controllable area within the variable range of the varicon capacitance.

In the plasma processing apparatus as described above, the variable inductor is configured to adjust an inductance value of the second power feeding unit to a value smaller than a value acquired when the variable inductor is substituted by a part of the central conductive member. In addition, the variable inductor is configured to switch the inductance of the second power feeding unit between at least two different inductance values.

According to a second aspect of the present disclosure, there is provided a plasma processing apparatus including: a processing container configured to be evacuated; an outer upper electrode installed annularly to face a lower electrode where an object to be processed is placed in the processing container; an inner upper electrode disposed to be insulated inside a radial direction of the outer upper electrode; a processing gas supply unit configured to supply a processing gas to a processing space between the outer upper electrode and the inner upper electrode, and the lower electrode; a first high-frequency power supply configured to output a first high-frequency wave having a frequency suitable for generating plasma of the processing gas; a first power feeding unit provided with a cylindrical conductive member consecutively connected to the outer upper electrode in a circumferential direction and configured to apply the first high-frequency wave from the first high-frequency power supply to the outer upper electrode through the cylindrical conductive member; a second power feeding unit provided with a rod-shaped central conductive member connected to the center of the inner upper electrode, and configured to branch the first high-frequency wave from the first high-frequency power supply from the first power feeding unit to supply the branched-off first high-frequency wave to the inner upper electrode through the central conductive member; a variable condenser installed in series to the central conductive member within the second power feeding unit; and a connector forming a branch point of the first power feeding unit and the second power feeding unit on the central conductive member and attached to the central conductive member to be displaced in an axial direction.

In the apparatus configured as described above, the resonance point is inevitably present in a capacitance variation range of the variable condenser (varicon). That is, the closed circuit is formed between the respective high-frequency power feeding units that distribute the high-frequency waves from the high-frequency power supply to both the inner upper electrode and the outer upper electrode through the electrostatic capacitor (fixed condenser) that is present between the inner upper electrode and the outer upper electrode. The closed circuit may include not only the electrostatic capacitor (fixed condenser) and the variable condenser (varicon) between the electrodes but also the inductance associated with the conductor of each high-frequency power feeding unit and the inductance of the variable inductor and the closed circuit becomes a resonance state when the capacitance of the variable condenser (varicon) has a predetermined value. However, by adjusting the position of the connector on a central conductive member, in particular, by adjusting inductance in an actual interval of the central conductive member to a low value, a characteristic around the resonance point may be broadened in the varicon capacitance-outer/inner power distribution ratio. Therefore, an area around the resonance point may be stably used as a controllable area within a variable range of varicon capacitance.

In the plasma processing apparatus as described above, the cylindrical conductive member includes a conductive bellows which is extendible in a vertical direction.

According to a third aspect of the present disclosure, there is provided a plasma processing apparatus including: a processing container configured to be evacuated; an outer upper electrode installed annularly to face a lower electrode where an object to be processed is placed in the processing container; an inner upper electrode disposed to be insulated inside a radial direction of the outer upper electrode; a processing gas supply unit configured to supply a processing gas to a processing space between the outer upper electrode and the inner upper electrode, and the lower electrode; a first high-frequency power supply configured to output a first high-frequency wave having a frequency suitable for generating plasma of the processing gas; a first power feeding unit provided with a cylindrical conductive member consecutively connected to the outer upper electrode in a circumferential direction and configured to apply the first high-frequency wave from the first high-frequency power supply to the outer upper electrode through the cylindrical conductive member; a second power feeding unit provided with a rod-shaped central conductive member connected to the center of the inner upper electrode, and configured to branch the first high-frequency wave from the first high-frequency power supply from the first power feeding unit to supply the branched-off first high-frequency wave to the inner upper electrode through the central conductive member; and a variable condenser installed in series to the central conductive member in the second power feeding unit. The variable condenser includes a fixed electrode electrically connected to the first high-frequency power supply and a movable electrode which is electrically connected to the inner upper electrode and is rectilinearly movable in the axial direction of the central conductive member while facing the fixed electrode, and the central conductive member is constituted by a hollow cylinder which is shorter than the variable condenser in the axial direction.

In the apparatus configured as described above, the resonance point is inevitably present in the capacitance variation range of the variable condenser (varicon). That is, the closed circuit is formed between the respective high-frequency power feeding units that distribute the high-frequency waves from the high-frequency power supply to both the inner upper electrode and the outer upper electrode through the electrostatic capacitor (fixed condenser) that is present between the inner upper electrode and the outer upper electrode. The closed circuit may include not only the electrostatic capacitor (fixed condenser) and the variable condenser (varicon) between the electrodes but also the inductance associated with the conductor of each high-frequency power feeding unit and the inductance of the variable inductor and the closed circuit becomes a resonance state when the capacitance of the variable condenser (varicon) has a predetermined value. However, since inductance of the central conductive member may be set as a small value by configuring the central conductive member by a hollow cylindrical body shorter than the variable condenser (varicon) disposed longitudinally in the axial direction, the characteristic around the resonance point may be broadened in the varicon capacitance—outer/inner power distribution ratio. Therefore, the area around the resonance point may be stably used as the controllable area within the variable range of the varicon capacitance.

In the plasma processing apparatus as described above, the central conductive member has a diameter which is equal to or larger than an axial length of the central conductive member. In addition, a part of a power transmission shaft configured to transfer a driving force from a driving source to the movable electrode of the variable condenser is received within the hollow cylinder.

In the plasma processing apparatus as described above, the driving source includes a motor, the variable condenser includes a driving unit configured to convert a rotational driving force to a straight driving force, and the power transmission shaft transfers the rotational driving force from the motor to the driving unit.

In the plasma processing apparatus as described above, the power transmission shaft includes: a first rotational shaft extending from the motor side to the inside of the hollow cylinder in a horizontal direction; a second rotational shaft extending vertically in the hollow cylinder; and a bevel gear installed within the hollow cylinder to connect the first rotational shaft to the second rotational shaft.

The plasma processing apparatus as described above further includes: a second high-frequency power supply configured to output a second high-frequency wave having a frequency suitable for attracting ions from the plasma into the object to be processed; and a third power feeding unit configured to apply the second high-frequency wave to the lower electrode from the second high-frequency power supply.

According to the plasma processing apparatus of the present disclosure, by such the configuration and the operation, in the capacitive-coupled plasma processing apparatus that distributes and supplies the high-frequency power to the inner upper electrode and the outer upper electrode disposed to face the lower electrode where the object to be processed is placed, the function can be remarkably improved as the adjustment knob for controlling the in-plane profile of the plasma density distribution characteristic of the variable condenser installed to control the outer/inner power distribution ratio or the process characteristic.

Hereinafter, exemplary embodiments of the present disclosure will be described with reference to the accompanying drawings.

[Configuration and Operation of Entire Apparatus]

FIG. 1 illustrates a configuration of a plasma processing apparatus according to an exemplary embodiment of the present disclosure. The plasma processing apparatus is configured as a capacitive-coupled plasma etching apparatus and includes, for example, a cylindrical chamber (processing container) 10 made of aluminum, of which the surface is alumite-processed (anodized). The chamber 10 is grounded.

A disk-shaped susceptor 12 where, for example, a semiconductor wafer W as an object to be processed is placed, is horizontally disposed at the center of the chamber 10, as a substrate holding plate which may be also as a high-frequency electrode. The susceptor 12 is made of, for example, aluminum and is supported on an insulative tubular supporter 14 that extends vertically upwards from the bottom of the chamber 10.

An annular exhaust path 18 is formed along the outer periphery of the insulative tubular supporter 14 between the conductive tubular supporter 16 that extends vertically upwards from the bottom of the chamber 10 and an inner wall of the chamber 10, an annular baffle plate 20 is attached to the top or an inlet of the exhaust path 18, and an exhaust port 22 is provided on the bottom of the chamber 10. A plurality of exhaust ports 22 may be provided at a regular interval in a circumferential direction so as to axisymmetrically maintain the uniform flow of gas in the chamber 10 in relation to the semiconductor wafer W on the susceptor 12.

An exhaust device 26 is connected to each exhaust port 22 through an exhaust pipe 24. The exhaust device 26 includes a vacuum pump such as, for example, a turbo molecular pump and may decompress a plasma processing space in the chamber 10 to a desired vacuum level. A gate valve 28 configured to open/close a carry-in/out port 27 of the semiconductor wafer W is attached outside a side wall of the chamber 10.

An RF bias lower high-frequency power supply 30 is electrically connected to the susceptor 12 through a lower matching unit 32 and a lower power feeding rod 34. The lower high-frequency power supply 30 is configured to output at variable power high-frequency waves $RF_L$ having a predetermined frequency (in general, 13.56 MHz or less, for example, 2 MHz) suitable for controlling energy of ions which are drawn in the semiconductor wafer W. The lower matching unit 32 accommodates a reactance variable matching circuit for matching between impedance at the lower high-frequency power supply 30 side and impedance at a load (primarily, the susceptor, plasma, and the chamber) side.

An electrostatic chuck 36 configured to hold the semiconductor wafer W with an electrostatic attraction force is installed on the top surface of the susceptor 12 and a focus ring 38 that surrounds the periphery of the semiconductor wafer W in a ring shape is installed outside a radial direction of the electrostatic chuck 36. The electrostatic chuck 36 is configured by inserting an electrode 36a formed of a conductive film between a pair of insulating films 36b and 36c and a high-voltage DC power supply 40 is electrically connected to the electrode 36a through a switch 42 and a coated wire 43. The semiconductor wafer W may be attracted and held on the electrostatic chuck 36 by an electrostatic force by high DC voltage applied from the DC power supply 40.

For example, an annular coolant chamber or a coolant path 44 that extends in a circumferential direction is provided within the susceptor 12. Coolant having a predetermined temperature, for example, cooling water cw is circulated and supplied to the coolant path 44 from a chiller unit (not illustrated) through pipes 46 and 48. A processing temperature of the semiconductor wafer W on the electrostatic chuck 36 may be controlled by the temperature of the coolant. In this regard, a heat-transfer gas from a heat-transfer gas supplying unit (not illustrated), for example, He gas, is supplied to a portion between the top surface of the electrostatic chuck 36 and a rear surface of the semiconductor wafer W through a gas supply pipe 50. A lift pin that is vertically movable through the susceptor 12 and an elevation mechanism (not illustrated) thereof are installed to load/unload the semiconductor wafer W.

An upper electrode 52 that faces the susceptor in parallel is installed above the susceptor (lower electrode) 12. A space between both electrodes 12 and 52 is a plasma generation space or a processing space PS. The upper electrode 52 forms a surface in contact with the plasma generation space PS, that is, an opposite surface by facing the semiconductor wafer W on the susceptor (lower electrode) 12. The upper electrode 52 is constituted by a ring-shaped or donut-shaped outer upper electrode 54 disposed to face the susceptor 12 by a predetermined interval and a disk-shaped inner upper electrode 56 insulated and disposed inside of the outer upper electrode 54 in a radial direction.

Figure 2:
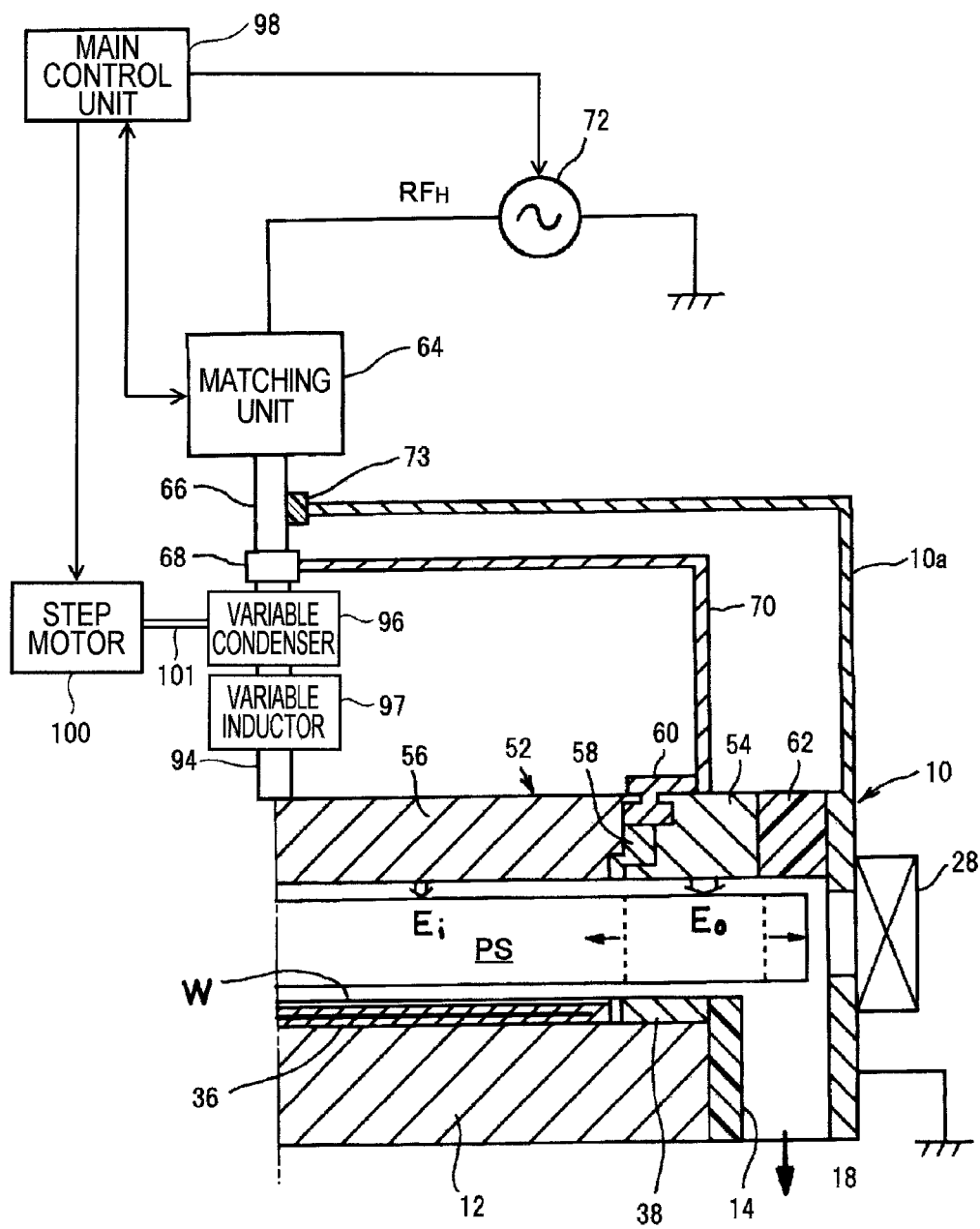
FIG. 2 is a view illustrating a configuration of a high-frequency power feeding unit in the plasma processing apparatus of FIG. 1.

FIG. 2 illustrates a configuration of an upper high-frequency power feeding unit in the plasma processing apparatus. As illustrated in FIG. 2, for example, an annular gap (clearance) having a size of 0.25 to 2.0 mm is formed between the outer upper electrode 54 and the inner upper electrode 56 and a dielectric 58 made of, for example, quartz, is installed in the gap. Ceramics 60 may be installed in the gap. A fixed condenser (electrostatic capacitor) $C_{58}$ is formed between both electrodes 54 and 56 with the dielectric 58 therebetween. Capacitance of the condenser $C_{58}$ is selected or adjusted to be a desired value according to the size of the gap and a dielectric constant of the dielectric 58. An annular insulative sealing member 62 made of, for example, alumina ($Al_2O_3$), is air-tightly attached between the outer upper electrode 54 and the side wall of the chamber 10.

The outer upper electrode 54 may be configured by a low-resistance conductor or semiconductor having small Joule heat, for example, silicon. An upper high-frequency power supply 72 is electrically connected to the outer upper electrode 54 through an upper matching unit 64, a first upper power feeding rod 66, a connector 68, and a power feeding tub (tubular conductive member) 70. The upper high-frequency power supply 72 outputs high-frequency waves $RF_H$ having a frequency (in general, 27 MHz or more, for example, 60 MHz) suitable for discharging the processing gas, that is, generating plasma. The upper matching unit 64 accommodates a reactance variable matching circuit for matching between impedance at the upper high-frequency power supply 72 side and impedance at the load (primarily, the susceptor, the plasma, and the chamber) side. An output terminal of the upper matching unit 64 is connected to the top of the first upper power feeding rod 66.

The power feeding tub 70 is constituted by a conductive plate having a cylindrical shape, a conical shape, or a shape similar thereto, for example, an aluminum plate or a copper plate, and the bottom of the power feeding tub 70 is consecutively connected to the outer upper electrode 54 in a circumferential direction and the top thereof is electrically connected to the lower end of the first upper power feeding rod 66 by the connector 68. Outside the power feeding tub 70, the side wall of the chamber 10 extends to a higher side than a height position of the upper electrode 52 to constitute a cylindrical ground conductor 10a. The top of the cylindrical ground conductor 10a is electrically insulated from the first upper power feeding rod 66 by a tubular insulating member 73. In such a configuration, in a load circuit viewed from the connector 68, a coaxial line is formed using the power feeding tub 70 and the outer upper electrode 54, and the cylindrical ground conductor 10a in which the power feeding tub 70 and the outer upper electrode 54 are used as a waveguide.

Referring back to FIG. 1, the inner upper electrode 56 includes an electrode plate 74 which includes a plurality of gas ejecting holes 74a, and is made of, for example, a semiconductor material such as Si or SiC, and an electrode support 76 made of a conductive material which detachably supports the electrode plate 74, for example, aluminum, of which the surface is alumite-processed. For example, two gas introducing chambers divided by an annular partition member 78 constituted by, for example, an O ring, that is, a central gas introducing chamber 80 and a peripheral gas introducing chamber 82 are provided within the electrode support 76. A central shower head is constituted by the central gas introducing chamber 80 and the plurality of gas ejecting holes 74a provided on the bottom thereof and a peripheral shower head is constituted by the peripheral gas introducing chamber 82 and the plurality of gas ejecting holes 74a provided on the bottom thereof.

A processing gas is supplied to the gas introducing chambers 80 and 82 from a common processing gas supply source 84 at a desired flow rate ratio. In more detail, a gas supply pipe 86 continued from the processing gas supply source 84 is divided into two branch pipes 86a and 86b to be connected to the gas introducing chambers 80 and 82, and flow control valves 88a and 88b are installed in the middle of the branch pipes 86a and 86b, respectively. Since conductances of paths up to the gas introducing chambers 80 and 82 from the processing gas supply source 84 are equal to each other, a flow rate ratio of the processing gases to be supplied to both gas introducing chambers 80 and 82 may be arbitrarily adjusted by adjusting the flow control valves 88a and 88b. A mass flow controller (MFC) 90 and an opening/closing valve 92 are installed in the middle of the gas supply pipe 86.

As described above, by adjusting the flow rate ratio of the processing gases to be introduced into the central gas introducing chamber 80 and the peripheral gas introducing chamber 82, a ratio of a flow rate of a gas ejected from the gas ejecting holes 74a of an electrode center corresponding to the central gas introducing chamber 80, that is, a central shower head and a flow rate of a gas ejected from the gas ejecting holes 74a of an electrode periphery corresponding to the peripheral gas introducing chamber 82, that is, a peripheral shower head may be arbitrarily adjusted. Flow rates per unit area of the processing gases ejected from the central shower head and the peripheral shower head may be different from each other. Each of gas species or gas mixture ratios of the processing gases ejected from the central shower head and the peripheral shower head may be independently or individually selected.

The upper high-frequency power supply 72 is electrically connected to the electrode support 76 of the inner upper electrode 56 through the upper matching unit 64, the first upper power feeding rod 66, the connector 68, and a second upper power feeding rod (central conductive member) 94. A variable condenser 96 configured to variably control the capacitance and a variable inductor 97 configured to variably control the inductance may be, in series, installed in the middle or on an extension line of the second upper power feeding rod 94. The capacitance of the variable condenser 96 is variably controlled within a predetermined range through a step motor (M) 100 by a main control unit 98. The inductance of the variable inductor 97 is generally variably controlled by a handling operation or a manual operation.

A low-pass filter (LPF) 102 configured to pass the high frequency waves (2 MHz) from the lower high-frequency power supply 30 through a ground without passing the high frequency waves (60 MHz) from the upper high-frequency power supply 72 is electrically connected to the inner upper electrode 56. The low-pass filter (LPF) 102 may be constituted by an LR filter or an LC filter, but may be constituted by only one wire which may provide a sufficiently large reactance to the high frequency waves (60 MHz) from the upper high-frequency power supply 72. Meanwhile, a high-pass filter (HPF) 104 configured to pass the high frequency waves (60 MHz) from the upper high-frequency power supply 72 through the ground is electrically connected to the susceptor 12.

The main control unit 98 is constituted by a computer system including a CPU or a memory, and controls individual operations of the respective units within the apparatus, in particular, for example, the high-frequency power supplies 30 and 72, the processing gas supply source 84 and the matching units 32 and 64, the step motor (M) 100, and an overall operation (sequence) of the apparatus.

In the plasma processing apparatus, a peak value detection circuit 106 configured to detect a peak-to-peak value $V_{PP}$ of the high frequency wave $RF_H$ applied to the upper electrode 52 (54 and 56) from the upper high-frequency power supply 72 is connected to the first upper power feeding rod 66 at an output side of the upper matching unit 64. The main control unit 98 receives a $V_{PP}$ measurement value $MV_{PP}$ from the peak value detection circuit 106 and uses the received $V_{PP}$ measurement value $MV_{PP}$ in variable adjustment of the capacitance of the variable condenser 96 and may use the received $V_{PP}$ measurement value $MV_{PP}$ in interlocking to be described below.

In the plasma processing apparatus, the semiconductor wafer W to be processed is first carried into the chamber 10 and is placed on the electrostatic chuck 36 while the gate valve 28 is opened in order to perform etching. Subsequently, the inside of the chamber 10 is exhausted by the exhaust device 26, an etching gas (in general, a mixed gas) is introduced from the processing gas supply source 84 into the gas introducing chambers 80 and 82 at a predetermined flow rate and a predetermined flow rate ratio, and a pressure within the chamber 10 is maintained at a set value by the exhaust device 26. Next, RF bias high frequency waves (2 MHz) $RF_L$ are applied to the susceptor 12 from the lower high-frequency power supply 30 at predetermined power and subsequently, the plasma generating high-frequency waves (60 MHz) $RF_H$ are also applied to the upper electrode 52 (54 and 56) from the upper high-frequency power supply 72 at predetermined power. The heat-transfer gas (He gas) is supplied to a contact interface between the electrostatic chuck 36 and the semiconductor wafer W from the heat-transfer gas supply unit and an electrostatic chuck switch 42 is turned on to confine the heat-transfer gas in the contact interface by the electrostatic attraction force. The etching gas ejected from the gas ejecting holes 74a of the inner upper electrode 56 is discharged under a high-frequency electric field from the upper electrode 52 (54 and 56) within the processing space PS to thereby generate plasma. A processed surface of the semiconductor wafer W is etched by radicals or ions included in the plasma.

[Operation of Upper High-Frequency Power Feeding Unit in Exemplary Embodiment (Different from Comparative Example)]

Figure 3:
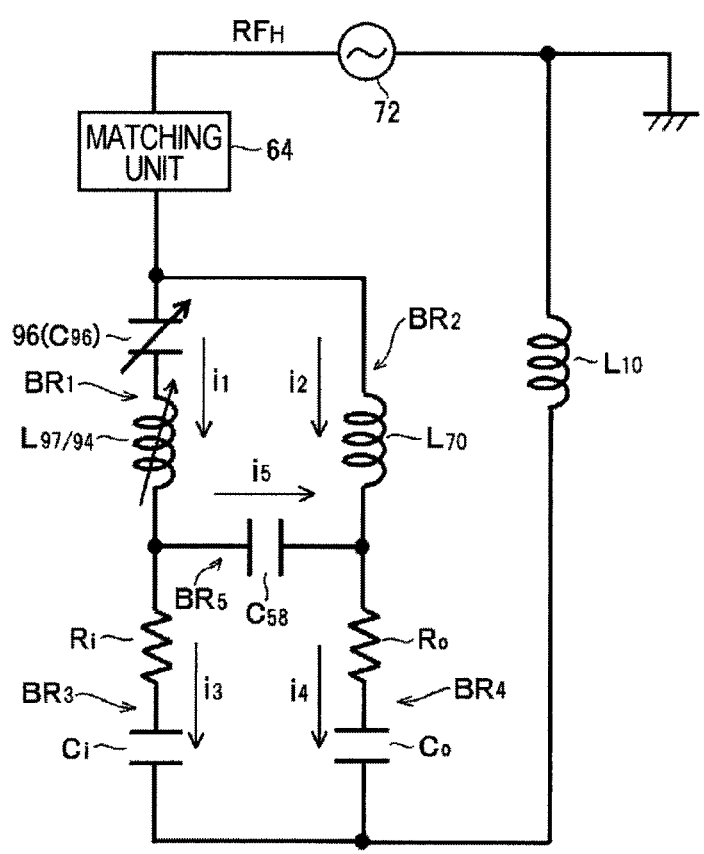
FIG. 3 is a circuit diagram illustrating an equivalent circuit of the high-frequency power feeding unit.

FIG. 3 illustrates an equivalent circuit of the upper high-frequency power feeding unit in the plasma processing apparatus. In the equivalent circuit, an inductor $L_{70}$ has an inductance of the power feeding tub 70, an inductor $L_{97/94}$ has a synthesis inductance acquired by summing up the inductance of the variable inductor 97 and the inductance of the second upper power feeding rod 94, and a fixed condenser $C_{58}$ has electrostatic capacitance formed between the outer upper electrode 54 and the inner upper electrode 56 with the dielectric 58 interposed therebetween. The inductors $L_{70}$ and $L_{97/94}$, the fixed condenser $C_{58}$, and the variable condenser 96($C_{96}$) form a closed-loop LC circuit. Resistances $R_o$ and $R_i$ and the condensers $C_o$ and $C_i$ represent the resistance and capacitance of ion sheaths formed just below the outer upper electrode 54 and the inner upper electrode 56, respectively. An inductor $L_{10}$ of a feedback circuit has the inductance of the chamber 10.

Figure 4:
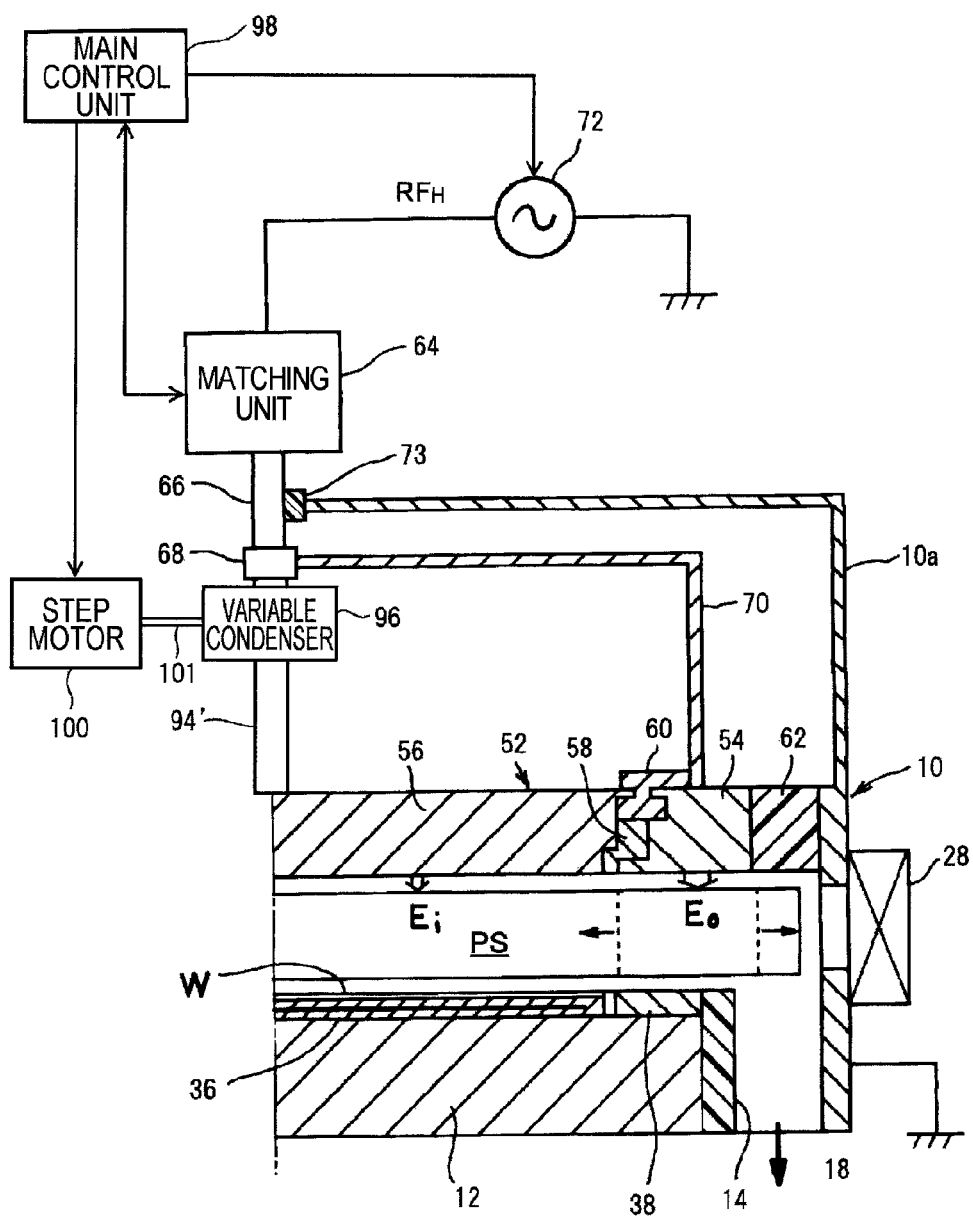
FIG. 4 is a view illustrating a configuration of a high-frequency power feeding unit in a plasma processing apparatus in the related art.

FIG. 4 illustrates a configuration of an upper high-frequency power feeding unit as Comparative Example in which the variable inductor 97 is not installed in the second upper power feeding rod 94. In the upper high-frequency power feeding unit of Comparative Example, the variable inductor 97 is substituted by a part of a second upper power feeding rod 94' and the second upper power feeding rod 94' is lengthened as much as the variable inductor 97 is not present. The upper high-frequency power feeding unit corresponds to the upper high-frequency power feeding unit of the apparatus in the related art.

Figure 5:
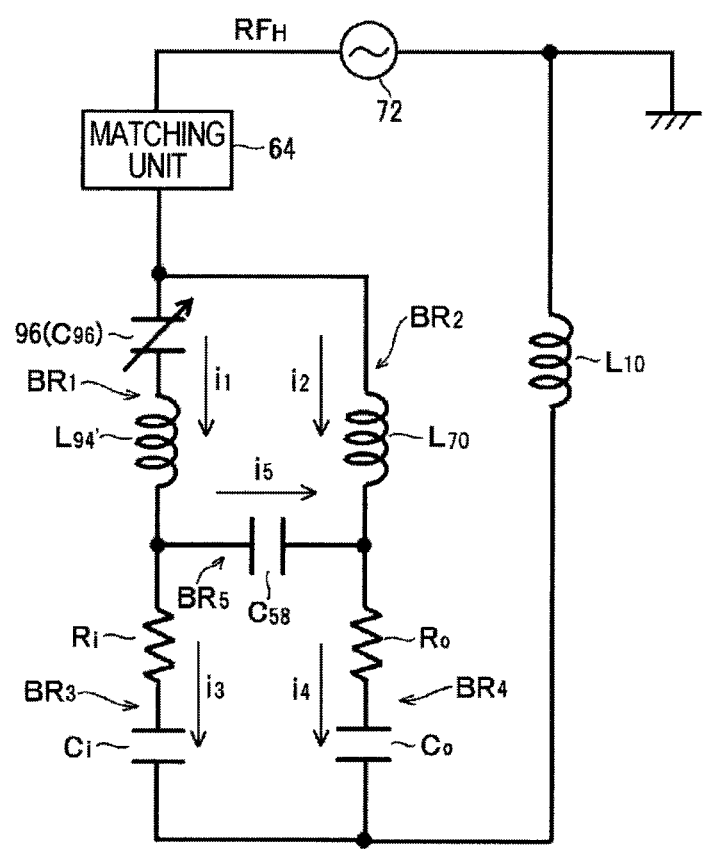
FIG. 5 is a circuit diagram illustrating an equivalent circuit of a high-frequency power feeding unit in the plasma processing apparatus in the related art.

FIG. 5 illustrates an equivalent circuit of the upper high-frequency power feeding unit in Comparative Example. In the equivalent circuit, the inductor $L_{94'}$ has the inductance of the second upper power feeding rod 94' that is lengthened as illustrated in FIG. 4. The closed-loop LC circuit is constituted by the inductor $L_{94'}$, the fixed condenser $C_{58}$, the variable condenser 96($C_{96}$), and the inductor $L_{70}$.

Figure 6A:
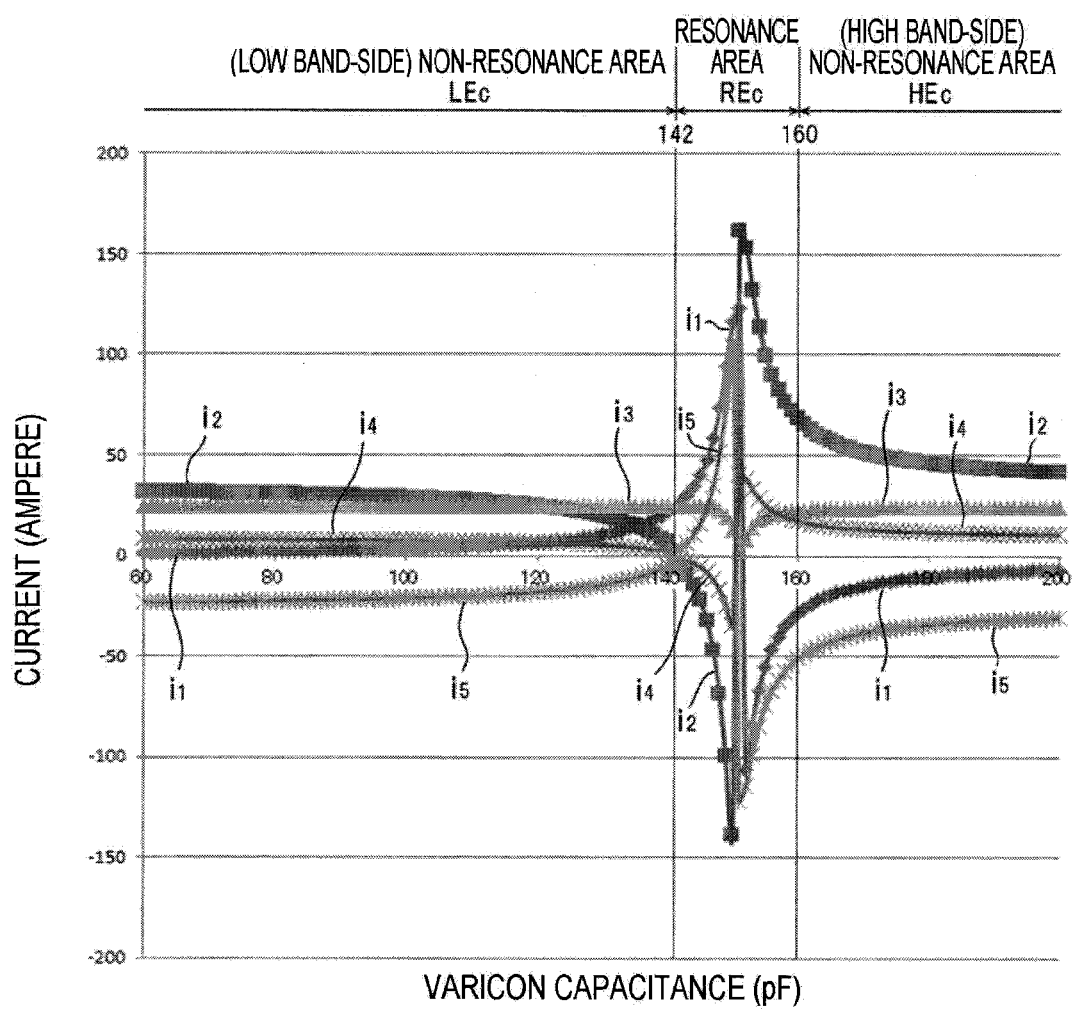
FIG. 6A is a graph illustrating varicon capacitance—branch current characteristics in the equivalent circuit of the high-frequency power feeding unit in the related art.
Figure 6B:
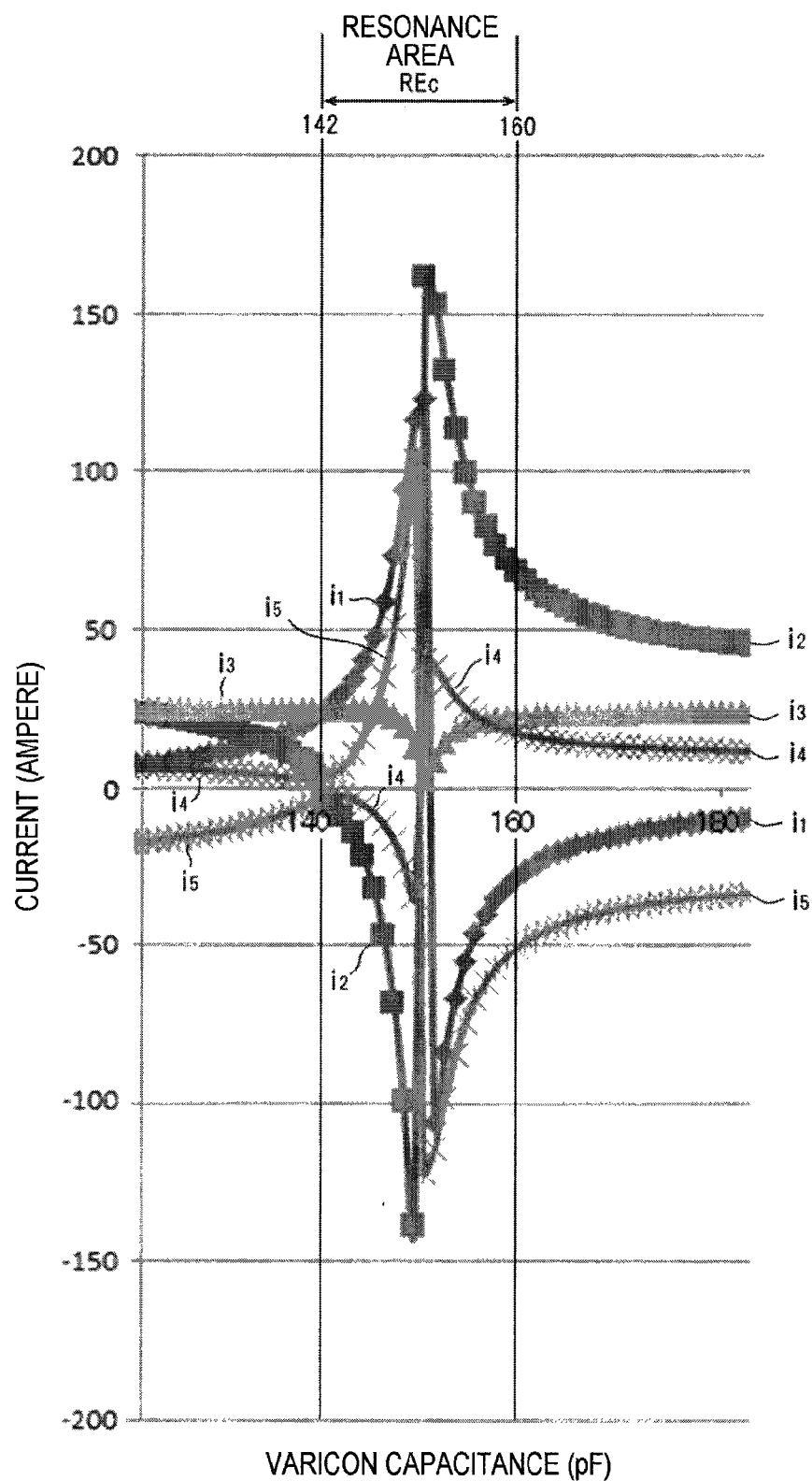
FIG. 6B is a graph illustrating a part (resonance area) of FIG. 6A in an enlarged scale.

In the equivalent circuit (FIG. 5) of Comparative Example, a current value of a current that flows on each branch varies depending on the capacitance or the varicon capacitance $C_{96}$ of the variable condenser 96. FIGS. 6A and 6B illustrate exemplary varicon capacitance-branch current characteristics. In FIGS. 6A and 6B, a value of the varicon capacitance $C_{96}$ of the variable condenser 96 is provided on a horizontal axis and a current value of a current $i_1$, $i_2$, $i_3$, $i_4$, or $i_5$ of each branch is provided on a vertical axis. Herein, $i_1$ represents a current that flows on a first branch $BR_1$ with the variable condenser 96 and the inductor $L_{94'}$, $i_2$ represents a current that flows on a second branch $BR_2$ with the inductor $L_{70}$, $i_3$ represents current that flows on a third branch $BR_3$ with a resistor $R_i$ and a condenser $C_i$, $i_4$ represents a current that flows on a fourth branch $BR_4$ with a resistor $R_o$ and a condenser $C_o$, and $i_5$ represents a current that flows on a fifth branch $BR_5$ with the fixed condenser $C_{58}$.

In the equivalent circuit of FIG. 5, the inductance of the inductor $L_{94'}$ is 50 nH, the inductance of the inductor $L_{70}$ is 15 nH, the inductance of the inductor $L_{10}$ is 25 nH, the capacitance of the condenser $C_{58}$ is 300 pF, a resistance value of the resistor $R_i$ is 0.8Ω, a resistance value of the resistor $R_o$ is 0.3Ω, the capacitance of the condenser $C_i$ is 6 nF, and the capacitance of the condenser $C_o$ is 100 pF. The varicon capacitance-branch current characteristics illustrated in FIGS. 6A and 6B are acquired by calculation by setting the frequency of the plasma generating high-frequency waves $RF_H$ output from the high-frequency power supply 72 as 60 MHz and the RF power as 500 W.

As illustrated in FIG. 6A, when the varicon capacitance $C_{96}$ of the variable condenser 96 is in an area of approximately 130 pF or less (when $C_{96}$<130 pF), the current $i_1$, $i_2$, $i_3$, $i_4$, or $i_5$ of each unit is hardly changed regardless of any change in the value of the varicon capacitance $C_{96}$. In particular, the current $i_3$ of the third branch $BR_3$ supplied to the plasma from the inner upper electrode 56 is hardly changed. The current $i_4$ of the fourth branch $BR_4$ supplied to the plasma from the outer upper electrode 54 is hardly changed in an area of $C_{96}$<120 pF and when $C_{96}$ is more than approximately 120 pF, the current $i_4$ starts to decreases gently. The current $i_5$ of the fifth branch $BR_5$ has a negative polarity and flows in an opposite direction to an arrow of FIG. 5.

However, when the varicon capacitance $C_{96}$ is more than approximately 130 pF, each of the currents $i_1$ and $i_5$ of the first and fifth branches $BR_1$ and $BR_5$ exponentially increases in a sharp curve, while the current $i_2$ of the second branch $BR_2$ exponentially decreases in the sharp curve, and the current $i_4$ of the fourth branch $BR_4$ also exponentially decreases in the slight sharp curve. However, the current $i_3$ of the third branch $BR_3$ is hardly changed and a present value is maintained. The current $i_3$ decreases only when the varicon capacitance $C_{96}$ becomes very close to a resonance point ($C_{96} \approx 152$ pF) (approximately 150 pF).

As illustrated in FIGS. 6A and 6B, in the illustrated example, each of the currents $i_1$ and $i_5$ of the first and fifth branches $BR_1$ and $BR_5$ reaches a highest value or a maximum value at approximately the resonance point ($C_{96} \approx 152$ pF). When the varicon capacitance $C_{96}$ is slightly changed (increases) therefrom, each of the currents $i_1$ and $i_5$ is inverted to a lowest value or a minimum value at a burst, and exponentially increases therefrom according to the increase of the varicon capacitance $C_{96}$. As a result, each of the currents $i_1$ and $i_5$ gradually comes close to a predetermined value (saturation value) according to the increase of the varicon capacitance $C_{96}$ in an area of $C_{96} > 160$ pF. However, the current $i_1$ of the first branch $BR_1$ flows in an inverse direction to a direction when $C_{96} < 130$ pF. A flow direction of the current $i_5$ of the fifth branch $BR_5$ is the same as the flow direction when $C_{96} < 130$ pF, but a current value (saturation value) of the current $i_5$ becomes larger than the current value when $C_{96} < 130$ pF.

Each of the currents $i_2$ and $i_4$ of the second and fourth branches $BR_2$ and $BR_4$ reaches the lowest value or the minimum value at approximately the resonance point ($C_{96} \approx 152$ pF). When the varicon capacitance $C_{96}$ is slightly changed (increases) therefrom, each of the currents $i_2$ and $i_4$ is inverted to the highest value or the maximum value at a burst, and exponentially decreases therefrom according to the increase of the varicon capacitance $C_{96}$. As a result, each of the currents $i_2$ and $i_4$ gradually comes close to a predetermined value (saturation value) according to the increase of the varicon capacitance $C_{96}$, in the area of $C_{96} > 160$ pF. However, both the currents $i_2$ and $i_4$ of the second and fourth branches $BR_2$ and $BR_4$ become larger than the currents $i_2$ and $i_4$ when $C_{96} < 130$ pF.

Meanwhile, the current $i_3$ of the third branch $BR_3$ reaches the lowest value or the minimum value at approximately the resonance point ($C_{96} \approx 152$ pF), and the current $i_3$ exponentially increases according to the increase of the varicon capacitance $C_{96}$ therefrom. However, the current $i_3$ is not inverted to the highest value or the maximum value, but gradually comes close to a value which is substantially equal to the current $i_3$ when $C_{96} < 130$ pF.

In the illustrated example, an area in a range of approximately 142 pF $< C_{96} < 160$ pF becomes a resonance area $RE_C$ around the resonance point ($C_{96} \approx 152$ pF). Herein, the resonance area $RE_C$ is first defined as a range up to a value (approximately 160 pF) of the varicon capacitance $C_{96}$ when the current $i_4$ of the fourth branch $BR_4$ returns to the saturation value from the value (approximately 142 pF) of the varicon capacitance $C_{96}$ when the current $i_4$ starts to decrease rapidly through heavy fluctuation of the resonance.

In the resonance area $RE_C$, as described above, even if the varicon capacitance $C_{96}$ is slightly changed, the currents $i_1$ to $i_5$ that respectively flow on the branches $BR_1$ to $BR_5$ of the upper high-frequency power feeding unit are significantly changed. Accordingly, a ratio of the currents $i_4$ and $i_3$ that flow on the fourth and third branches $BR_4$ and $BR_3$ corresponding to a power distribution ratio of the outer upper electrode 54 and the inner upper electrode 56, that is, an outer/inner power distribution ratio $P_o/P_i$, that is, an outer/inner current ratio $i_4/i_3$ is also significantly changed at a rapid change rate (inclination). As a result, fine adjustment is difficult.

At approximately the resonance point ($C_{96} \approx 152$ pF), since the current $i_1$ of the first branch $BR_1$ is largely inclined to the highest value (maximum value), the variable condenser 96 may be damaged. In this regard, in the plasma processing apparatus in the related art, which includes the upper high-frequency power feeding unit having the same configuration as Comparative Example, it is not very preferable that the varicon capacitance $C_{96}$ is set in the resonance area $RE_C$ to perform a plasma processing or while the plasma processing is performed, the value of the varicon capacitance $C_{96}$ is variably adjusted to be put in the resonance area $RE_C$ or pass through the resonance area $RE_C$, and interlocking is also performed in the main control unit 98.

Figure 7:
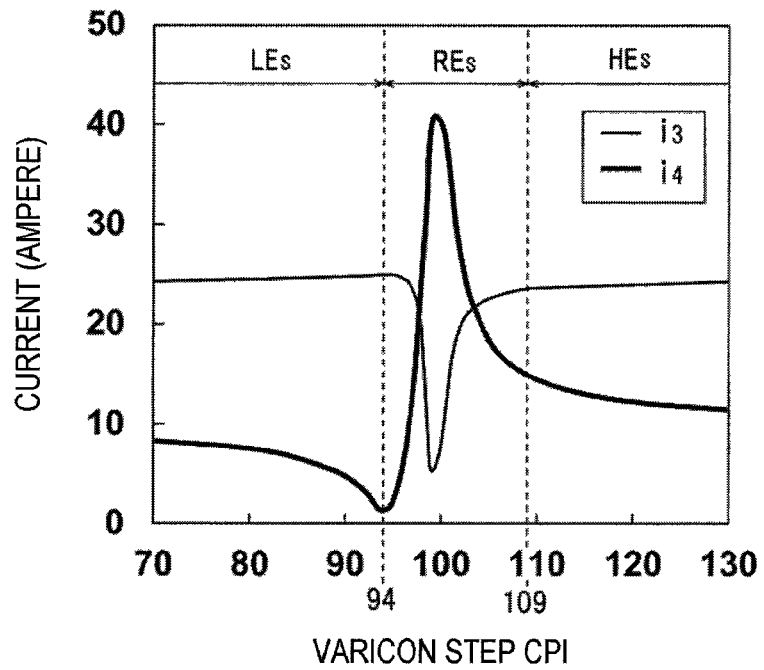
FIG. 7 is a view illustrating inner current and outer current characteristics in the equivalent circuit of FIG. 5 in comparison with each other.
Figure 8:
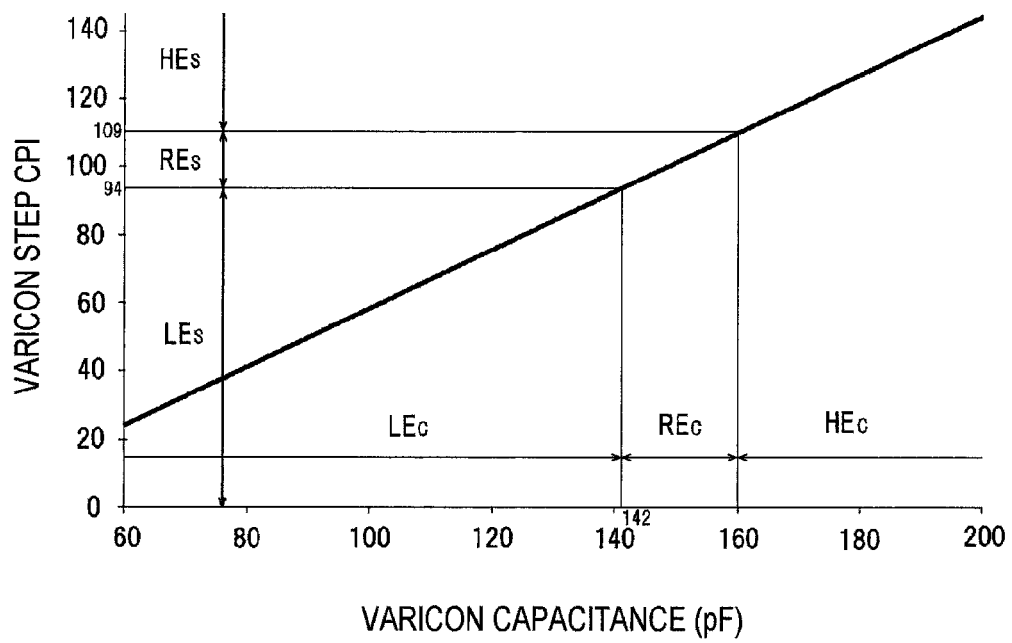
FIG. 8 is a view illustrating a correspondence relationship between a varicon capacitance and a varicon step in a variable condenser.

FIG. 7 illustrates the respective characteristics of the current (inner current) $i_3$ of the third branch $BR_3$ and the current (outer current) $i_4$ of the fourth branch $BR_4$ extracted from the graphs of FIGS. 6A and 6B in comparison with each other. On the horizontal axis, a value of a varicon step CPI of the variable condenser 96 is provided. Herein, the varicon step CPI is a control variable at the variable condenser 96 side viewed from the main control unit 98 (that is, directly controllable) after the main control unit 98 variably controls the varicon capacitance $C_{96}$ of the variable condenser 96 through the step motor (M) 100 and is generally granted a step number (integer) which is continued within a predetermined range. A linear corresponding relationship is provided between the varicon capacitance $C_{96}$ of the variable condenser 96 and the varicon step CPI as illustrated in FIG. 8. A resonance area $RE_S$ of the varicon step CPI which corresponds to the resonance area RE (142 pF $< C_{96} < 160$ pF) of the varicon capacitance $C_{96}$ is in the range of 94 $<$ CPI $<$ 109.

As illustrated in FIG. 7, in a non-resonance area $LE_S$ (CPI $<$ 94) of a (first) low band side lower than the resonance area $RE_S$, the current value of the inner current $i_3$ is hardly changed, but substantially constant (approximately 24 amperes). In contrast, when the varicon step CPI comes close to the resonance area $RE_S$, that is, when the varicon step CPI is more than 70, the current value of the outer current $i_4$ monotonously decreases in a gentle curve from a previous saturation value (approximately 8 amperes). Accordingly, in the low band side non-resonance area $LE_S$ (CPI $<$ 94), the outer/inner current ratio $i_4/i_3$ is hardly changed and is substantially constant (approximately 0.33) regardless of any change in the varicon step CPI when the varicon step CPI is 70 or less, and when the varicon step CPI is more than 70, the outer/inner current ratio $i_4/i_3$ gradually decreases and becomes thus approximately 0.15 just before the resonance area $RE_S$ (CPI=93). That is, a variable range of the outer/inner current ratio $i_4/i_3$ is approximately 0.15 to approximately 0.33.

In the non-resonance areas $LE_S$ and $HE_S$, the outer/inner current ratio $i_4/i_3$ is always less than 1 and the outer/inner power distribution ratio $P_o/P_i$ is also always less than 1. However, a ratio of an electric field intensity Eo just below the outer upper electrode 54 and an electric field intensity Ei just below the inner upper electrode 56, that is, an outer/inner electric field intensity ratio Eo/Ei is always more than 1. That is, since an area $S_{54}$ of the outer upper electrode 54 is still smaller than an area $S_{56}$ of the inner upper electrode 56 (generally, 1/10 or less), an RF power density per unit area in the outer upper electrode 54, $P_o/S_{54}$ (moreover, the electric field intensity Eo just below) is higher than an RF power density per unit area in the inner upper electrode 56, $P_i/S_{56}$ (moreover, the electric field intensity Ei just below).

As described above, in any area of the low band-side non-resonance area $LE_S$ (CPI<94) and the high-band side non-resonance area $HE_S$ (CPI>109) which are substantial use areas of the variable condenser 96, a variable range or a dynamic range of the outer/inner current ratio $i_4/i_3$ is not large. In the conventional art, since only one area, in particular, the low band-side non-resonance area $LE_S$ (CPI<94) is primarily used, the outer/inner power distribution ratio $P_o/P_i$ may not arbitrarily be varied, and as a result, an effect as an adjustment knob for controlling a plasma density distribution or an etching characteristic in a radial direction is slightly insufficient.

Figure 9:
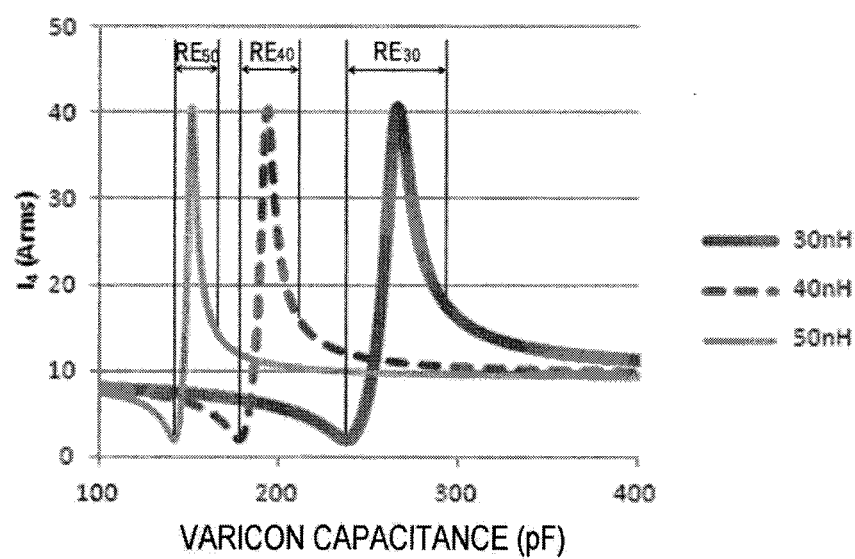
FIG. 9 is a view illustrating varicon capacitance—fourth branch current characteristics when an inductance of a variable inductor decreases stepwise in the equivalent circuit (Example) of FIG. 3.
Figure 10:
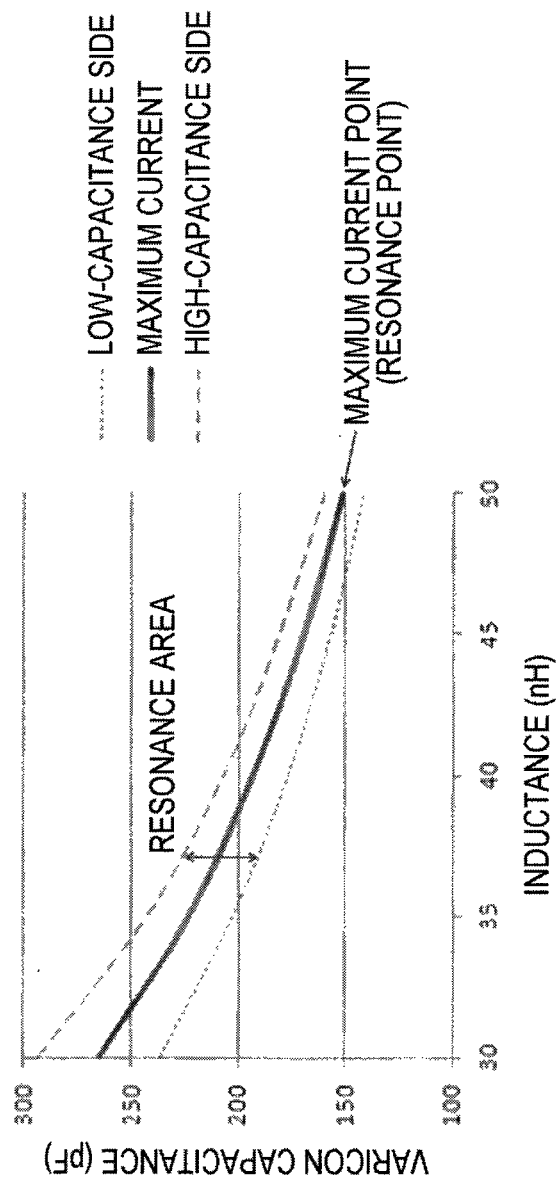
FIG. 10 is a view illustrating a correlation between the inductance of the variable inductor and the resonance area in the varicon capacitance in an LC circuit formed in an upper high-frequency power feeding unit.

However, referring back to FIG. 3, in the equivalent circuit of the exemplary embodiment, when the inductance of the synthesis inductor $L_{97/94}$ of the first branch $BR_1$ including the variable inductor 97 is set to 50 nH, the equivalent circuit is fully the same as the equivalent circuit of FIG. 5, thereby acquiring the same varicon capacitance—branch current characteristic as illustrated in FIGS. 6A and 6B. However, when the inductance of the synthesis inductor $L_{97/94}$ decreases from 50 nH to 40 nH, and decreases up to 30 nH, for example, when referring to a characteristic of the current $i_4$ of the fourth branch $BR_4$ for the varicon capacitance $C_{96}$ of the variable condenser 96, a value of the varicon capacitance when resonance occurs, that is, the resonance point is shifted to a high-capacitance side in the order of 152 pF→190 pF→270 pF and the resonance area $RE_C$ is significantly widened in the order of $RE_{50}$ (142 pF<$C_{96}$<160 pF)→$RE_{40}$ (175 pF<$C_{96}$<210 pF)→$RE_{30}$ (230 pF<$C_{96}$<295 pF) as illustrated in FIGS. 9 and 10.

Figure 11:
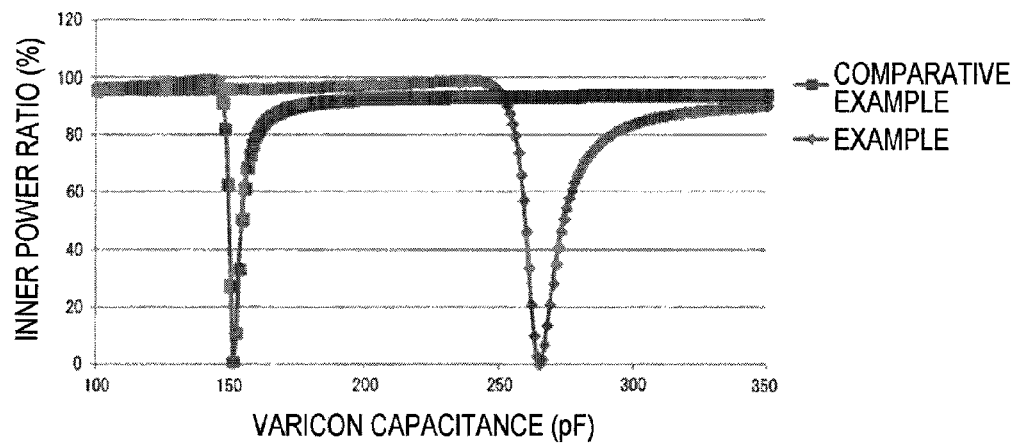
FIG. 11 is a view illustrating varicon capacitance—inner power ratio characteristics in Example and Comparative Example.

This means that the resonance area is widened similarly when the inductance of the synthetic inductor $L_{97/94}$ decreases even in a characteristic of a varicon capacitance—inner power ratio (a ratio of power input into plasma through the inner upper electrode 56 from the matching unit 64). That is, as illustrated in FIG. 11, when the inductance of the synthesis inductor $L_{97/94}$ decreases from 50 nH to 30 nH, the characteristic of the varicon capacitance—inner power ratio is broad around the resonance point because the resonance area is widened. As a result, a resonance area which is substantially a use prevention area in Comparative Example within the variable range of the varicon capacitance $C_{96}$ of the variable condenser 96 may be stably used in the plasma processing apparatus of the present exemplary embodiment.

In more detail, in the variable condenser 96, a rotational amount of a varicon rotating part that is rotated by rotating the step motor 100 is monitored by an optical sensor using pulse light having a predetermined frequency and for example, a rotational amount of one rotation of the varicon rotating part is set to 80 pulses. In general, an allowance amount of rotation deviation of the varicon rotating part is ±1 pulse. In this case, 1 pulse corresponds to a rotational amount of 4.5° and is approximately 0.3 pF in capacitance (capacitance value) terms, and as a result, a maximum allowance error of the varicon capacitance is approximately 0.6 pF which is twice.

However, in Comparative Example in which the inductance of the inductor $L_{94'}$ is 50 nH, as illustrated in FIG. 11, the characteristic of the varicon capacitance—inner power ratio is very sharp at approximately the resonance point, and as a result, when the varicon capacitance $C_{96}$ is deviated by 0.6 pF, the inner power ratio is significantly deviated by approximately 21%, and as a result, controlling is substantially impossible.

In contrast, when the inductance of the synthesis inductor $L_{97/94}$ decreases to 30 nH in the exemplary embodiment, as illustrated in FIG. 11, the characteristic of the varicon capacitance—inner power ratio becomes broad around the resonance point, and as a result, an error of the inner power ratio when the varicon capacitance $C_{96}$ is deviated by 0.6 pF is merely approximately 7%. As a result, some or many portions of the resonance area may be used as a controllable area, that is, the variable range of the varicon capacitance $C_{96}$.

Figure 12:
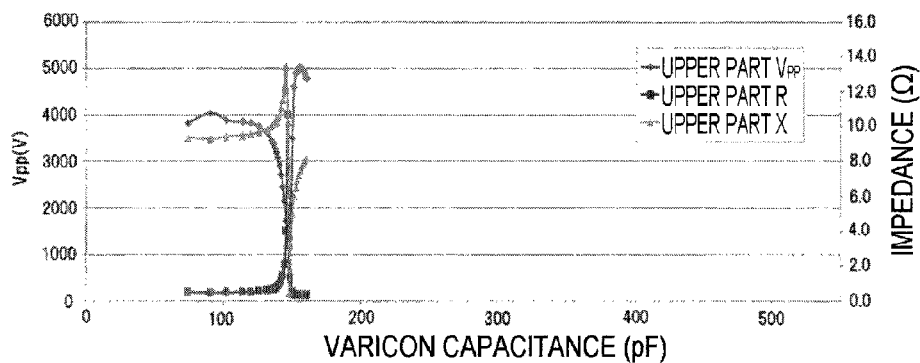
FIG. 12 is a view illustrating a varicon capacitance—upper $V_{PP}$ characteristic and a varicon capacitance—upper load impedance characteristic in Comparative Example.
Figure 13:
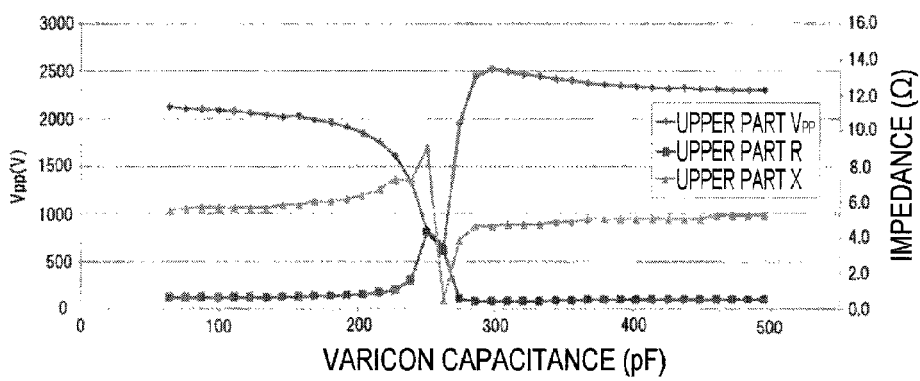
FIG. 13 is a view illustrating a varicon capacitance—upper $V_{PP}$ characteristic and a varicon capacitance—upper load impedance characteristic in Example.

A difference between Comparative Example (when the inductance of the inductor $L_{94'}$ is 50 nH in the equivalent circuit) in which the variable inductor 97 is not installed in the second upper power feeding rod 94 and Example (when the inductance of the synthetic inductor $L_{97/94}$ is 30 nH) has been verified through a test in a varicon capacitance—upper Vpp (a peak-to-peak value of the high frequency wave $RF_H$, Vpp) characteristic as illustrated in FIGS. 12 and 13. Herein, the varicon capacitance—upper Vpp characteristic is a measurable characteristic in an actual process substantially corresponding to the characteristic of the varicon capacitance—inner power ratio acquired by the calculation of the equivalent circuit as described above.

In the actual process, the peak value detection circuit 106 (FIG. 1) that measures the upper Vpp is generally inserted into the matching unit 64 and is configured to measure the upper load impedance (R+jX) when the plasma is viewed from the output terminal of the matching unit 64 through the upper high-frequency power feeding unit, as well. As a result, FIGS. 12 and 13 also illustrate a varicon capacitance—load impedance (upper R and upper X) characteristic measured in the same test together with the varicon capacitance—upper Vpp characteristic.

The test was performed by etching a photoresist film with a $SiO_2$ film as a mask. As a condition of a primary process, a mixed gas (a flow rate of 20/200 sccm) of $O_2$ and Ar was used as the etching gas, and the pressure within the chamber 10 was set to 10 mTorr, an output of the upper high-frequency power supply 72 was set to 500 W, and an output of the lower high-frequency power supply 30 was set to 300 W.

As illustrated in FIG. 12, the varicon capacitance—upper Vpp characteristic in Comparative Example (when the inductance of the inductor $L_{94'}$ is 50 nH in the equivalent circuit) in which the variable inductor 97 is not installed in the second upper power feeding rod 94 is significantly similar to the varicon capacitance—inner power ratio characteristic of Comparative Example illustrated in FIG. 11 and is very steep around the resonance point.

Meanwhile, as illustrated in FIG. 13, the varicon capacitance—upper Vpp characteristic of Example (when the inductance of the synthesis inductor $L_{97/94}$ is set to 30 nH) is significantly similar to the varicon capacitance—inner power ratio characteristic of Example illustrated in FIG. 11 and is remarkably broad around the resonance point.

[Configuration of Variable Inductor (Example)]

Figure 14A:
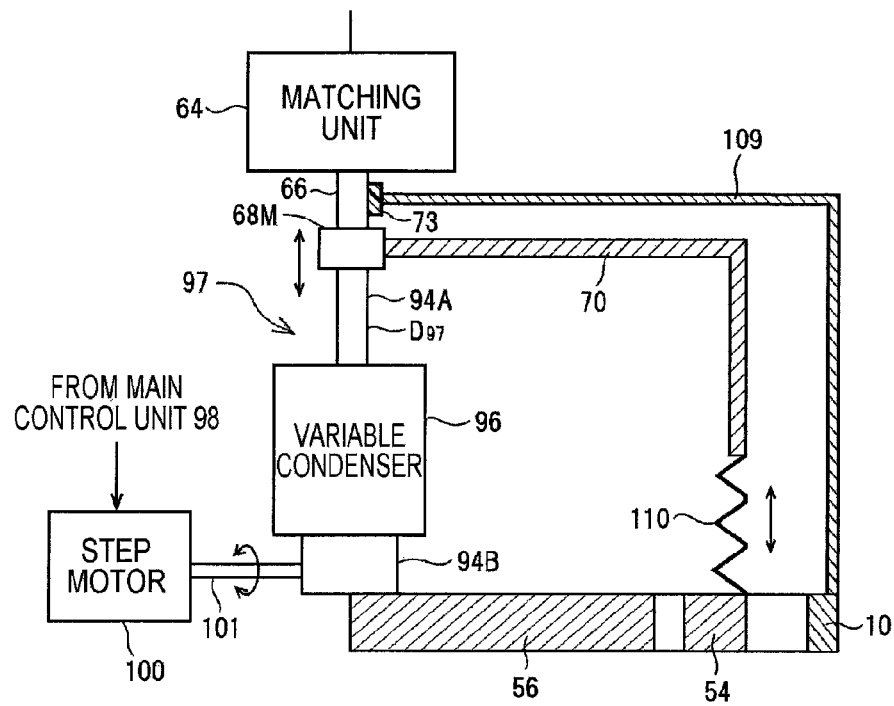
FIG. 14A is a view illustrating a preferred configuration (a state in which the impedance has a maximum value) of the variable inductor in the exemplary embodiment.
Figure 14B:
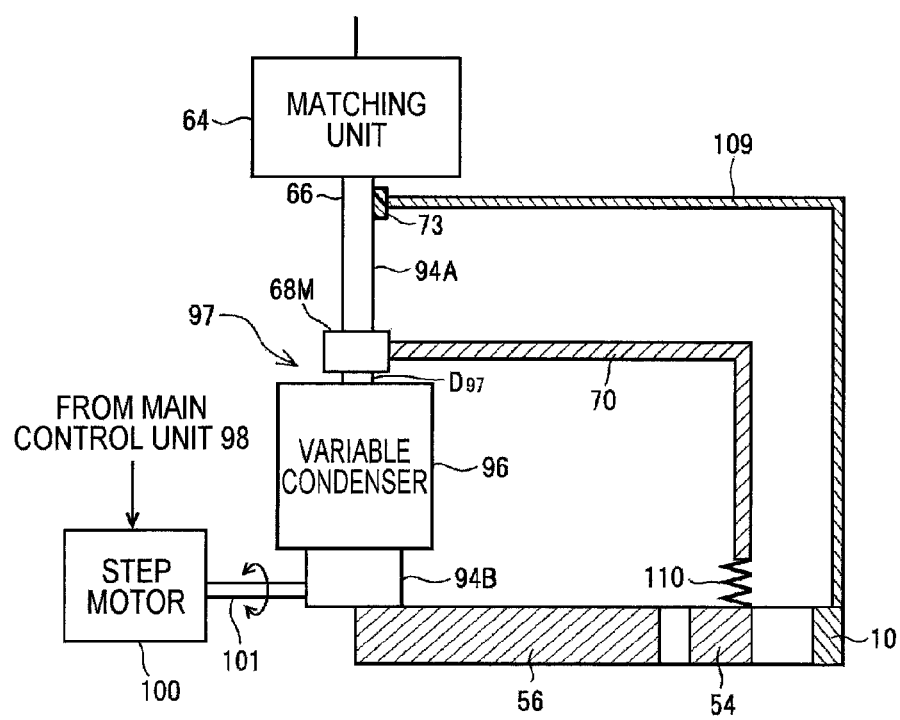
FIG. 14B is a view illustrating a configuration (a state in which the impedance has a minimum value) of the variable inductor.

FIGS. 14A and 14B illustrate an exemplary configuration (Example) of the variable inductor 97 in the exemplary embodiment. In this Example, the second upper power feeding rod 94 is divided into an upper central conductor 94A and a lower central conductor 94B with the variable condenser 96 interposed therebetween.

The upper central conductor 94A as an extension of the first upper power feeding rod 66 is integrally formed with the first upper power feeding rod 66 and is electrically connected to the upper terminal (fixed electrode) of the variable condenser 96. A connector 68M for distributing or branching high-frequency power from the matching unit 64 to the power feeding tub 70, and further to the outer upper electrode 54 is configured to slide in the axial direction on the upper central conductor 94A and includes a contact band (not illustrated). As a result, the connector 68M may be electrically excellently (that is, at low contact resistance) connected to the upper central conductor 94A or the first upper power feeding rod 66 at a predetermined position within a displaceable range.

The lower central conductor 94B is electrically connected to the lower terminal (movable electrode) of the variable condenser 96 and electrically connected to the inner upper electrode 56 by direct contact. The lower central conductor 94B is configured as a hollow cylinder and a part (in particular, a bevel gear 128) of a power transmission shaft for transferring a rotational driving force from the step motor 100 to a movable electrode driving unit 116 (FIG. 15) in the variable condenser 96 is received in the lower central conductor 94B.

A lower part of the power feeding tub 70 is configured as a bellows 110 made of a conductive metal. The bellows 110 is transformed to be extendible in a vertical direction according to a height position of the connector 68M.

The variable inductor 97 has an inductance of a substantial interval $D_{97}$ between the connector 68M of the upper central conductor 94A and the variable condenser 96 and a value of the inductance is varied according to the height position of the connector 68M. That is, as illustrated in FIG. 14A, when the connector 68M is fixed to a highest position in the displaceable range on the upper central conductor 94A, the inductance $L_{97}$ of the interval $D_{97}$ becomes a maximum value. As illustrated in FIG. 14B, when the connector 68M is fixed to a lowest position in the displaceable range on the upper central conductor 94A, the inductance of the interval $D_{97}$ becomes a minimum value.

As described above, by changing the height position of the connector 68M on the upper central conductor 94A, the inductance of the substantial interval $D_{97}$ of the upper central conductor 94A may be adjusted to the minimum value or a value thereround. By this configuration, the synthesis inductance (total inductance of the second upper power feeding rod 94) acquired by summing up the inductance of the variable inductor 97 and the inductance of the lower central conductor 94B may decreases to a value (30 nH or less) which is still lower than the value (50 nH) of the inductance of the second upper power feeding rod 94' in Comparative Example (FIG. 4).

Figure 15:
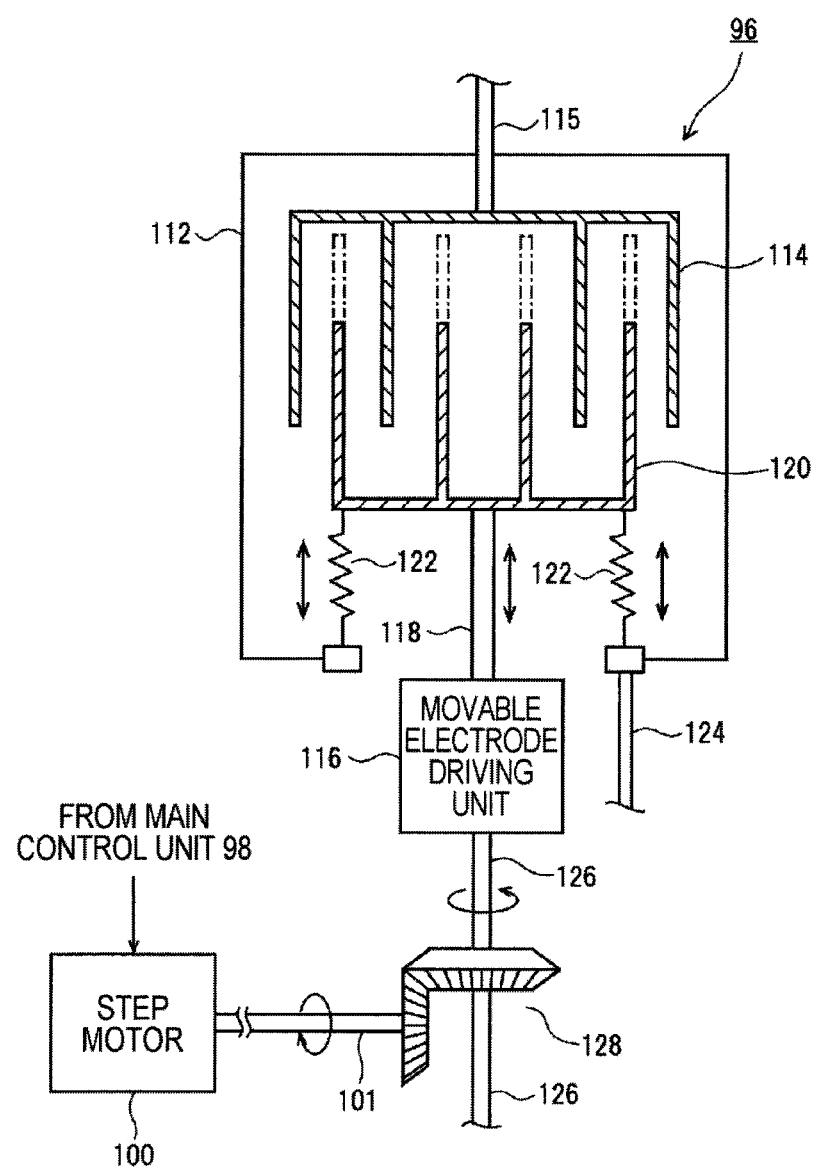
FIG. 15 is a view illustrating a configuration of the variable condenser in the exemplary embodiment.

In this exemplary configuration, the variable condenser 96 that displaces the movable electrode 120 illustrated in FIG. 15 in a longitudinal (vertical) direction is disposed longitudinally and coaxially with the second upper power feeding rod 94 and a power transmission mechanism is installed within the lower central conductor 94B of the hollow cylinder as described above. The configuration has the following advantage. That is, since pipes for supplying coolant to the inner upper electrode 56 as well as pipes of a gas supply system are installed inside the power feeding tub 70, a predetermined space needs to be ensured in a height direction. Accordingly, the variable condenser 96 is disposed in the vertical (longitudinal) direction, and as a result, the second upper power feeding rod 94 (in particular, the lower central conductor 94B) may be shortened to that extent. Making the second upper power feeding rod 94 (in particular, the lower central conductor 94B) be thick as possible is also preferable in lowering the inductance.

In FIG. 15, the variable condenser 96 is constituted as a vacuum varicon and includes a fixed electrode 114 constituted by a plurality of concentric cylinders that is fixed and disposed in a vacuum-sealed housing 112 and a movable electrode 120 constituted by a plurality of concentric cylinders, which is configured to move in the axial direction (vertical direction) through a support shaft 118 by straight driving of a movable electrode driving unit 116 while facing the fixed electrode 114 in the radial direction. The fixed electrode 114 is electrically connected to the upper central conductor 94A (FIGS. 14A and 14B) through a rod-shaped or plate-shaped connection conductor 115. The movable electrode 120 is electrically connected to the lower central conductor 94B (FIGS. 14A and 14B) through the conductive bellows 122 and the rod-shaped or plate-shaped connection conductor 124.

The movable electrode driving unit 116 is joined to the step motor 100 through a vertical rotation shaft 126 extending perpendicularly downwards up to the inner upper electrode 56 within the lower central conductor (hollow cylinder) 94B, a bevel gear 128 accommodated within the lower central conductor 94B, and a horizontal rotation shaft 101 that extends horizontally between the inside and the outside of the lower central conductor 94B. The vertical rotation shaft 126 is rotatably supported on a bearing (not illustrated) installed in the inner upper electrode 56. The step motor 100 may be disposed outside the power feeding tub 70 or outside the cylindrical ground conductor 10a (FIG. 1).

The movable electrode driving unit 116 includes a mechanism (for example, a ball screw mechanism) that converts a rotational driving force into a straight driving force. The main control unit 98 may shift the movable electrode 120 to a desired position in the axial direction (vertical direction) through the power transmission mechanisms 101, 128, and 126 and the movable electrode driving unit 116 by controlling the rotational amount of the step motor 100 and variably control the capacitance of the variable condenser 96.

Another Exemplary Embodiment or Modified Example

In the aforementioned exemplary embodiment, the inductance of the variable inductor 97 may be consecutively varied. However, the variable inductor 97 may be configured to be switched between at least two different inductance values. However, even in such a case, the inductance needs to be switched to an inductance (preferably, 30 nH or less) which is lower than the inductance (50 nH) acquired when the variable inductor 97 is substituted by a part of the second upper power feeding rod 94, that is, in Comparative Example (FIG. 4).

Figure 16:
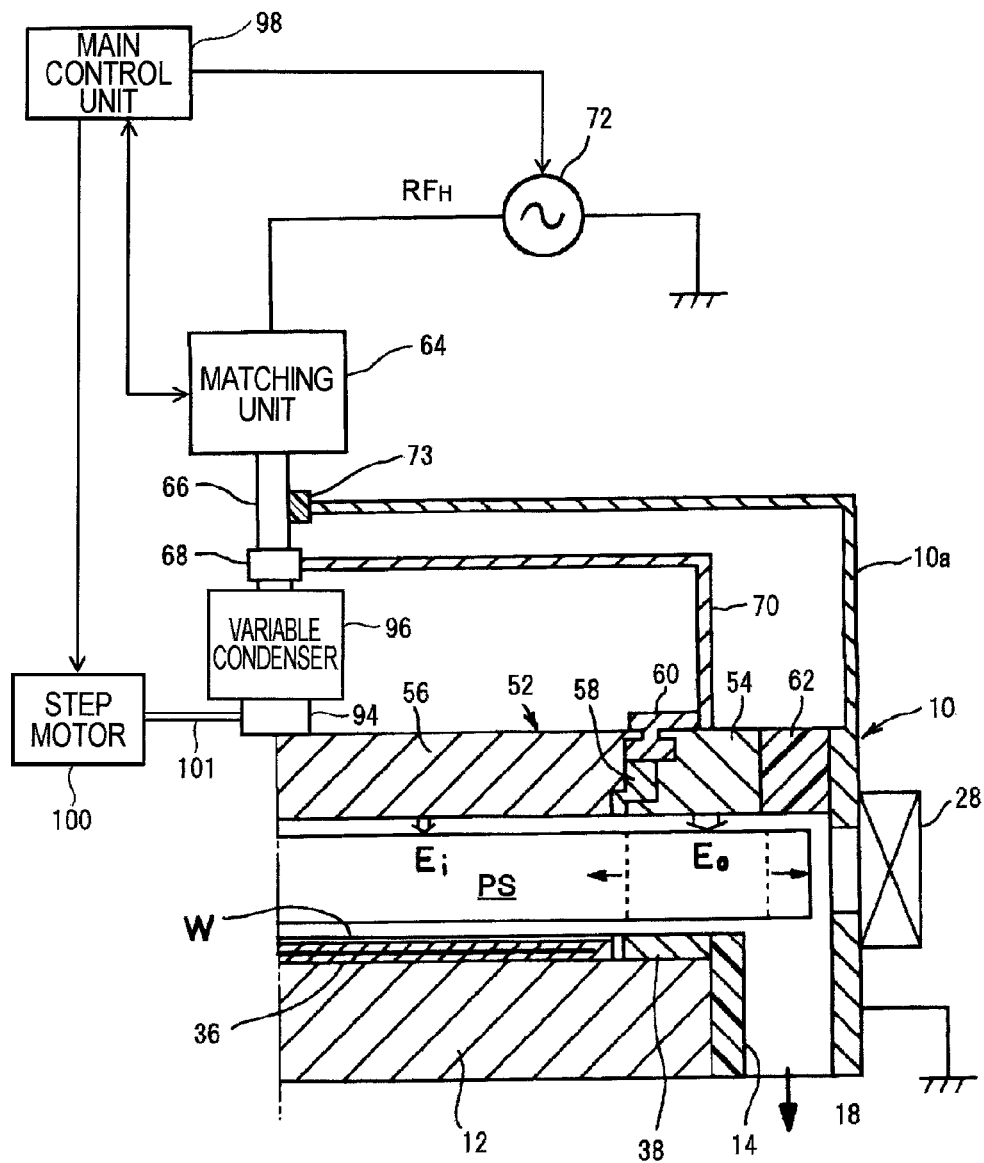
FIG. 16 is a view illustrating a configuration of an upper high-frequency power feeding unit in another exemplary embodiment.

FIG. 16 illustrates a configuration of an upper high-frequency power feeding unit in another exemplary embodiment. In the exemplary embodiment, a variable condenser 96 is installed on the second upper power feeding rod 94, but the variable inductor 97 is not installed. Instead, the second upper power feeding rod 94 is remarkably shortened, and as a result, the upper high-frequency power feeding unit includes a stationary structure and an inductance of a fixed value corresponding to a state of FIG. 14B in the aforementioned exemplary embodiment. The inductance (fixed value) of the second upper power feeding rod 94 becomes lower as the second upper power feeding rod 94 is shorter or thicker. In order to lower the inductance of the second upper power feeding rod 94 to the low value (30 nH or less) as described above, it is preferable that at least the second upper power feeding rod 94 is shorter than the longitudinal variable condenser 96. It is more preferable that the diameter of the second upper power feeding rod 94 is equal to or larger than the length of the second upper power feeding rod 94.

The capacitive-coupled plasma processing apparatus of the present disclosure is not limited to the plasma etching apparatus according to the above described exemplary embodiments and may be applied to a capacitive-coupled plasma processing apparatus that performs predetermined plasma processes such as, for example, plasma CVD, plasma ALD, plasma oxidation, plasma nitrification, sputtering. The object to be processed in the present disclosure is not limited to the semiconductor wafer and may include, for example, a flat panel display, an organic EL, various substrates for a solar cell, a photomask, a CD substrate, a print substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus, comprising:
    a processing container configured to be evacuated;
    an outer upper electrode installed annularly to face a lower electrode where an object to be processed is placed in the processing container;
    an inner upper electrode disposed to be insulated inside a radial direction of the outer upper electrode;
    a processing gas supply source configured to supply a processing gas to a processing space between the outer upper electrode and the inner upper electrode, and the lower electrode;
    a first high-frequency power supply configured to output a first high-frequency wave having a frequency suitable for generating plasma of the processing gas;
    a first power feeder provided with a cylindrical conductive member consecutively connected to the outer upper electrode in a circumferential direction and configured to apply the first high-frequency wave from the first high-frequency power supply to the outer upper electrode through the cylindrical conductive member;
    a second power feeder provided with a rod-shaped central conductive member connected to the center of the inner upper electrode, and configured to branch the first high-frequency wave from the first high-frequency power supply from the first power feeder to supply the branched-off first high-frequency wave to the inner upper electrode through the central conductive member;
    a variable condenser and a variable inductor installed in series to the central conductive member in the second power feeder; and
    a controller constituted by a computer system including a CPU programmed to adjust a power distribution ratio of the outer upper electrode and the inner upper electrode by controlling a capacitance of the variable condenser to be in a range of 230 pF to 295 pF,
    wherein a synthetic inductance is defined as a sum of an inductance of the variable inductor and an inductance of the central conductive member of the second power feeder, and the synthetic inductance is set to be about 30 nH.

2. The plasma processing apparatus of claim 1, wherein the variable inductor is configured to adjust an inductance value of the second power feeder to a value smaller than a value acquired when the variable inductor is substituted by a part of the central conductive member.

3. The plasma processing apparatus of claim 1, wherein the variable inductor is configured to switch the inductance of the second power feeder between at least two different inductance values.

4. The plasma processing apparatus of claim 1, further comprising:
    a second high-frequency power supply configured to output a second high-frequency wave having a frequency suitable for attracting ions from the plasma into the object to be processed; and
    a third power feeder configured to apply the second high-frequency wave to the lower electrode from the second high-frequency power supply.

5. The plasma processing apparatus of claim 1, further comprising:
    a peak value detection circuit connected to the first power feeder and configured to detect a peak-to-peak value of the first high-frequency wave applied to the outer upper electrode and the inner upper electrode from the first high-frequency power supply,
    wherein the controller is programmed to control the capacitance of the variable condenser according to the peak-to-peak value of the first high-frequency wave detected by the peak value detection circuit.

* * * * *